United States Patent [19]

Kosuge et al.

[11] Patent Number: 4,888,774
[45] Date of Patent: Dec. 19, 1989

[54] ERROR DETECTION SYSTEM

[75] Inventors: Hiroshi Kosuge; Yoshio Kiriu, both of Kanagawa, Japan

[73] Assignee: Hitachi, Ltd., Tokyo, Japan

[21] Appl. No.: 132,993

[22] Filed: Dec. 15, 1987

[30] Foreign Application Priority Data

Dec. 18, 1986 [JP] Japan .................. 61-302226

[51] Int. Cl.$^4$ .............................. G06F 11/10
[52] U.S. Cl. ................................. 371/38.1
[58] Field of Search ................... 371/37, 38, 39, 40

[56] References Cited

U.S. PATENT DOCUMENTS

| | | | |
|---|---|---|---|
| 4,359,772 | 11/1982 | Patel | 371/39 |
| 4,450,561 | 5/1984 | Gotze et al. | 371/37 |
| 4,692,922 | 9/1987 | Kiriu et al. | 371/37 |

OTHER PUBLICATIONS

"Error Correcting Codes for SemiConductor Memory Applications: A State of the Art Review" by C. L. Chen and M. Y. Hsiao.

*Primary Examiner*—Charles E. Atkinson
*Attorney, Agent, or Firm*—Fay, Sharpe, Beall, Fagan, Minnich & McKee

[57] ABSTRACT

An error detecting apparatus in which an error within an arbitrary and continuous (b-1) bit block is detected using a SEC-DED-SbED code. The (b-1) bit block is any continuous (b-1) bit block within an information consisting of several b bit blocks. The data are encoded by using a power of a matrix C, defined as:

$$C = \begin{vmatrix} 1 & 1 & 1 & \ldots & 1 & & 1 \\ 1 & & & & & & \\ & 1 & & & & & \\ & & 1 & & & & \\ & & & 1 & & & \\ & & & & \cdot & & \\ & & & & & 1 & \\ & & & & & & 1 \end{vmatrix} \begin{vmatrix} 1 \\ 2 \\ 3 \\ 4 \\ \cdot \\ b-1 \\ b \end{vmatrix}$$

$$1 \quad 2 \quad 3 \quad \ldots \quad b-1 \quad b$$

and a matrix B. Matrix B is comprised by arbitrarily replacing the rows and columns of the power of C matrix with row vectors from a set of (b+1) vectors:

$$\begin{aligned} D0 &= 1\ 1\ 1\ \ldots\ 1\ 1 \\ D1 &= 1\ 0\ 0\ \ldots\ 0\ 0 \\ D2 &= 0\ 1\ 0\ \ldots\ 0\ 0 \\ &\int \\ Db &= 0\ 0\ 0\ \ldots\ 0\ 1 \end{aligned}$$

The partial matrices obtained from matrices B and C are used to construct a parity matrix. Syndromes are computed from the information and the party matrix to detect errors.

26 Claims, 8 Drawing Sheets

ERROR DETECTION SYSTEM

BACKGROUND OF THE INVENTION

This invention relates to an error detection apparatus and more particularly to an error detection apparatus suitable for detecting block errors. A block error is an error in at least three of the bits in a set of bits. The invention is particularly applicable to detecting and correcting single bit errors, detecting double bit errors in a data word, detecting single block errors in a data word, and detecting a three or more bit burst error in a block or in a (b-1) bit block where b is the number of bits in a data block. The (b-1) bit block is contained in a data block or may extend across the boundary of two data blocks in the data word.

The following systems (1) and (2) are known conventionally as an error correction/detection system using SEC-DED-SbED codes (Single bit Error Correcting-Double Bit Error Detecting—Single b bit byte Error Detecting Codes):

(1) A system using the codes described on pages 593-598 of the journal of Electrocommunication Society, May, 1984, Japan.

(2) A system using the codes described on page 129 of IBM J.R&D, Vol. 28, No. 2, March, 1984.

The SEC-DED-SbED code is the code obtained by adding the detection capacity of the mass of a plurality (b) of bits such as a byte to a 1-bit error correction/2-bit error detection code (SEC-DED code) that is widely used for a main memory unit. This code is helpful in improving the reliability of a semiconductor memory devices using a memory element having data output of a plurality of bits. In the new SEC-DED-SbED codes described in the item (a), the maximum code bit length $L_0$ is given by $$L_0 = (b+2) \cdot b \cdot 2^{r-b-2}$$

where r is the number of inspection bits ($r \geq b+2$) and b is a byte length.

When the byte length $b \leq 16$ bits, it has a code length longer than the conventional codes. When the number of inspection bits $r = b+2$, it provides a circulating minimum weight code suitable for improving the operation and packaging density of LSI for the coding/decoding circuit. In the meantime, it may be required to detect block errors for block division of two or more kinds of blocks. When, for example, an IC memory of a 4-bit structure is driven by a driver IC of a 3-bit structure, it is desired to detect the block error for the 4-bit block and at the same time, to detect also the block error for the 3-bit block. In this case, if the SEC-DED-SbED code is constituted according to the prior art technique described above, the 4-bit block error can be detected but the 3-bit block error spreading over the 4-bit blocks cannot be detected generally.

SUMMARY OF THE INVENTION

A purpose of the present invention is to provide an error correction/detection system which solves the problem of the prior art technique as described above, detects a b-bit block error and at the same time, a block error of up to (b-1)-bit block and can further detect an error inside arbitrary continuous (b-1)-bits [(b-1)-bit burst error] by use of the SEC-DED-SbED code.

In accordance with the invention, an error detection apparatus comprises means for generating information which has a plurality of bits; means for obtaining syndrome on the basis of the information and a parity matrix containing at least one of the following b*b partial parity matrices Ao to Ab and means responsive to the obtained syndrome for detecting error of the information:

where $A_i$ (i=0~b) is a b*b matrix with $A_i = B \cdot C^i$, and $C^i$ (i=0~b) is a b×b matrix multiplied i times by C, that is $$C = \begin{vmatrix} 1 & 1 & 1 & \ldots & 1 & & 1 \\ & 1 & & & & & \\ & & 1 & & & & \\ & & & 1 & & & \\ & & & & \cdot & & \\ & & & & & 1 & \\ & & & & & & 1 \\ 1 & 2 & 3 & \ldots & b-1 & b & \end{vmatrix} \begin{vmatrix} 1 \\ 2 \\ 3 \\ 4 \\ \cdot \\ \cdot \\ b-1 \\ b \end{vmatrix}$$

B is a b×b matrix obtained by arbitrarily replacing the rows and columns of $C^i$.

By this means, the apparatus will effect 3-or-more-bit error detection inside the same block/burst of more than 3 arbitrary bits but below (b-1) bits. The alternative form of the partial parity matrices $A_i$(0=i to b) is obtained by circulatingly replacing by i bits each row of Ao, where $$A_o = \begin{vmatrix} 1 & 1 & 1 & \ldots & 1 & & 1 \\ & 1 & & & & & \\ & & 1 & & & & \\ & & & & \cdot & & \\ & & & & & 1 & \\ & & & & & & 1 \\ 1 & 2 & 3 & \ldots & b-1 & b & \end{vmatrix} \begin{vmatrix} 1 \\ 2 \\ 3 \\ \cdot \\ \cdot \\ \cdot \\ b-1 \\ b \end{vmatrix}$$

Ab is defined by I which is a b×b unit matrix.

Both forms of the parity matrix P comprises a b×b matrix, which has row vector $D_0$ and b-1 different row vectors selected from b row vectors $D_1$ to $D_b$ wherein $D_0 \ldots D_b$ are defined as follows:

$$\begin{aligned} D0 &= 1 \; 1 \; 1 \; \ldots \; 1 \; 1 \\ D1 &= 1 \; 0 \; 0 \; \ldots \; 0 \; 0 \\ D2 &= 0 \; 1 \; 0 \; \ldots \; 0 \; 0 \\ &\int \\ Db &= 0 \; 0 \; 0 \; \ldots \; 0 \; 1 \end{aligned}$$

According to the invention, it can be detected whether even number bit error or odd number bit error occurs because of row vector $D_o$. If the even number bit error occurs, syndrome for the row vector $D_o$ is "0". If the odd number bit error occurs, syndrome for the $D_o$ is "1".

According to the invention, it can be detected whether 1-bit error or 3-or-more error occurs because of b-1 different row vectors selected from b row vectors $D_1$ to $D_b$. If a 1-bit error occurs, the syndrome of these vectors is "1". If a 3-or-more bit error occurs, the syndrome is "3" or more.

The weight of the syndrome is 1 or 2 if a 1-or-2-bit error occurs. If a 3-or-more bit error occurs, the weight of the syndrome is 3 or more.

Thus, this invention distinguishes 3-or-more bit error from 1-or-2-bit errors.

BRIEF DESCRIPTION OF THE DRAWINGS

The invention may take form in certain parts and arrangements of parts which will be described in detail in this specification and illustrated in the accompanying drawings which form a part thereof and wherein.

DESCRIPTION OF THE PREFERRED EMBODIMENT

Figure 1:
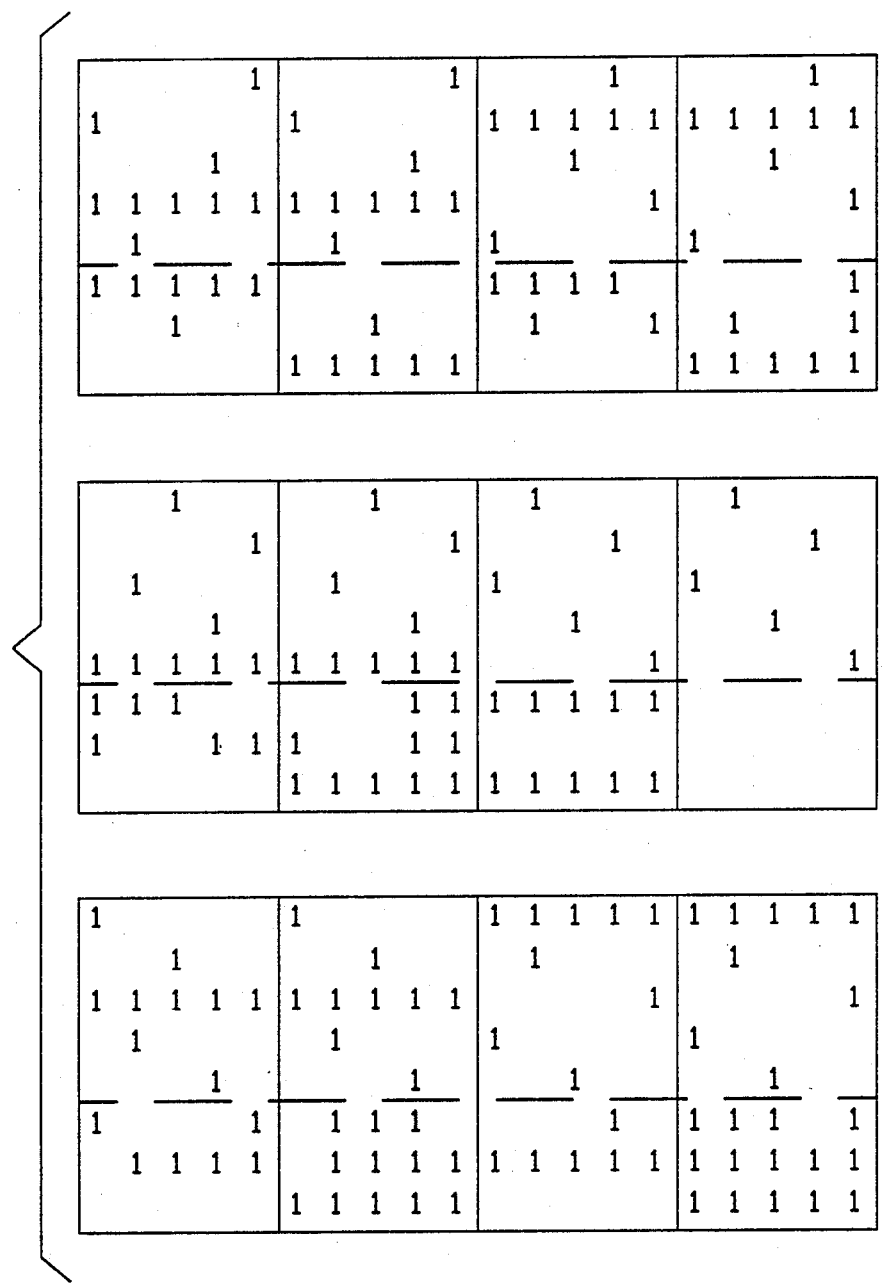
FIG. 1 is a diagram of the parity matrix used by the error correction/detection system of the present invention.

The reason this invention can detect a b-bit block error and a (b-1)-bit burst error is the embodiment of decoding information consisting of a plurality of blocks made up of a plurality of (b) bits in a parity matrix. The parity matrix $P = [A_0 \ldots A_0 A_1 \ldots A_1 \ldots A_b \ldots A_b]$ and will be described in detail below.

First, the properties of the matrix Ai and P will be explained.

The matrix $C^i$ (i=0~b) is as follows:

$$C^0 = \begin{vmatrix} 1 & & & & & & \\ & 1 & & & & & \\ & & 1 & & & & \\ & & & \cdot & & & \\ & & & & \cdot & & \\ & & & & & 1 & \\ & & & & & & 1 \\ 1 & 2 & 3 & \ldots & b-1 & b \end{vmatrix} \begin{vmatrix} 1 \\ 2 \\ 3 \\ 4 \\ \cdot \\ b-1 \\ b \end{vmatrix}$$

$$C^1 = \begin{vmatrix} 1 & 1 & \ldots & 1 & 1 & & \\ 1 & & & & & & \\ & 1 & & & & & \\ & & \cdot & & & & \\ & & & & 1 & & \\ & & & & & 1 & \\ 1 & 2 & 3 & \ldots & b-1 & b \end{vmatrix} \begin{vmatrix} 1 \\ 2 \\ 3 \\ 4 \\ \cdot \\ b-1 \\ b \end{vmatrix}$$

$$C^2 = \begin{vmatrix} & & & & & 1 & \\ 1 & 1 & \ldots & 1 & 1 & & 1 \\ 1 & & & & & & \\ & 1 & & & & & \\ & & \cdot & & & & \\ & & & 1 & & & \\ 1 & 2 & 3 & \ldots & b-2 & b-1 & b \end{vmatrix} \begin{vmatrix} 1 \\ 2 \\ 3 \\ 4 \\ \cdot \\ b-1 \\ b \end{vmatrix}$$

$$C^b = \begin{vmatrix} 1 & & & & & & \\ & 1 & & & & & \\ & & \cdot & & & & \\ & & & 1 & & & \\ & & & & 1 & & \\ & & & & & 1 & \\ & & & & & & 1 \\ 1 & 2 & 3 & \ldots & b-1 & b \end{vmatrix} \begin{vmatrix} 1 \\ 2 \\ \cdot \\ b-3 \\ b-2 \\ b-1 \\ b \end{vmatrix}$$

The matrix B is a b×b matrix obtained by arbitrarily replacing the rows and columns of $C^i$ (i=0~b). The matrix B is composed by selecting b different row vectors from among the following (b+1) row vectors $D_0$ to $D_b$:

$$\begin{aligned} D0 &= 1\ 1\ 1\ \ldots\ 1\ 1 \\ D1 &= 1\ 0\ 0\ \ldots\ 0\ 0 \\ D2 &= 0\ 1\ 0\ \ldots\ 0\ 0 \\ &\int \\ Db &= 0\ 0\ 0\ \ldots\ 0\ 1 \end{aligned}$$

When the kth row of the matrix B is the row vector $D_j$ (j=0~b), the kth row of the matrix P becomes as follows by calculating the product between the vector $D_j$ and the matrix $C^0 \sim C^b$:

When j=0; $D_0 \ldots D_0 D_b \ldots D_b \ldots D_1 \ldots D_1$
When j=1; $D_1 \ldots D_1 D_0 \ldots D_0 \ldots D_2 \ldots D_2 \ldots$
when j=b: $D_b \ldots D_b D_{b-1} \ldots D_{b-1} \ldots D_0 \ldots D_0$ The following can be derived from above.

(Property i)

The matrix Ai is composed of b different row vectors among the row vectors $D_0$ to $D_b$.

(Property ii)

The b×2b matrix [AiAi+1] as part of the matrix P is composed by selecting b different row vectors from among the following (b+1) row vectors $E_0$ to $E_b$:

$$E_0 = D_0 D_b = 1\,1\ldots 1\,1 \quad 0\ldots 0\,0\,1$$
$$E_1 = D_1 D_b = 1\,0\ldots 0\,0 \quad 1\ldots 1\,1\,1$$
$$\int$$
$$E_0 = D_0 D_b = 1\,1\ldots 1\,1 \quad 0\ldots 0\,0\,1$$
$$E_b = D_b D_{b-1} = 0\,0\ldots 0\,1 \quad 0\ldots 0\,1\,0$$
$$\underbrace{\phantom{11\ldots11}}_{b} \quad \underbrace{\phantom{0\ldots001}}_{b}$$

$$F_0 = 1\,1\ldots 1\,0\ldots 0\,0$$
$$F_1 = 0\,0\ldots 0\,1\ldots 1\,1$$
$$F_2 = 1\,0\ldots 0\,0\ldots 0\,0$$
$$\int$$
$$F_b = 0\,0\ldots 0\,0\ldots 0\,1$$
$$\underbrace{\phantom{11\ldots10\ldots00}}_{b-1}$$

A parity matrix containing the matrix P as derived above is used by the apparatus for decoding information on the basis of the properties described above, a b-bit block error and a (b-1)-bit burst error can be detected. Since an arbitrary 2-bit error can be detected by the SEC-DED code, a 3-or-more-bit error inside a b-bit block and a 3-or-more-bit but less than (b-1)-bit burst error can be detected by combining the two methods. This is accomplished by calculating the weight of the b-bit syndrome, Sp, which is defined by the matrix P. The weight of the b-bit syndrome is defined as follows:

When a 1-bit error occurs, the weight is the number of "1"s in the column corresponding to the bit where the error occurred.

When the 2-bit error occurs, the weight is the number of "1"s in the modulo-2-sum of the two columns which correspond to the two bits where the errors occurred.

When a 3-bit error occurs, the weight is the number of "1"s in the modulo-2 sum of the three columns which correspond to the three bits where the errors occurred.

When 4 and more bits error occurred, the weight is obtained the same manner as explained above.

From the property (i), the weight of each column of the matrix $A_1$ is 1 or 2; therefore, the weight of Sp for a 1-bit error is 1 or 2.

(1) The weight of Sp for the 3-or-more-bit inside a block is at least 3. For, from the property (i) of the matrix $A_i$ which defines the bits within a block:

(a) The weight of Sp is equal to the error bit number and at least 3 when $A_i$ does not contain $D_0$;

(b) The weight of the syndrome corresponding to the (b-1)th row of $A_i$ exclusive of $D_0$ is at least 3 for 4-or-more-bit errors;

(c) When $A_i$ contains $D_0$, the weight of the syndrome for the (b-1) row of $A_i$ exclusive of $D_0$ is 2 or 3 for a 3-or-more-bit error and the syndrome for the $D_0$th row is "1"; therefore, the weight of Sp is at least 3.

(2) The weight of Sp for the up-to-b bit but 3-or-more bit burst error spreading over two blocks having the same matrix $A_i$ is at least 3. This is true since the column vectors constituting the matrix that corresponds to the b-bit burst error is equivalent to the column vectors constituting the matrix $A_i$. Thus, the same discussion in the item (1) holds true for this case.

(3) The weight of Sp for the up-to-(b-1)-bit but 3-or-more-bit burst error spreading over two blocks having two different matrices $A_i$ and $A_{i+1}$ is at least 3. This occurs because the matrix $X_{ij}$ corresponding to the (b-1)-bit burst is composed of b different row vectors among the following (b+1) row vectors, $F_0 \sim F_b$, from the property (ii):

(a) When $X_{ij}$ does not contain $F_0$ or $F_1$, the weight of the syndrome of the matrix $X_{ij}$ corresponding to the (b-1)th row other than $F_0$ and $F_1$ is at least 3;

(b) When $X_{ij}$ contains $F_0$ and $F_1$, the weight of the syndrome of the matrix $X_{ij}$ corresponding to the (b-2)th row other than $F_0$ and $F_1$ is at least 3 for the 4-or-more-bit errors;

(c) When $X_{ij}$ contains $F_0$ and $F_1$, the weight of the syndrome of the matrix $X_{ij}$ corresponding to the (b-2)th row other than $F_0$ and $F_1$ is 2 or 3 for the 3-bit errors and either one of the syndromes corresponding to the $F_0$th or $F_1$th row is "1"; therefore, the weight of Sp is at least 3.

From the items (1), (2), and (3) described above, the weight of Sp for the 3-or-more-bit error inside the block and the up-to-(b-1)-bit but 3-or-more-bit burst error is at least 3, and they can be detected without being mistaken as the 1-bit errors having the weight of 1 or 2.

FIG. 1 is a diagram showing one structural example of the parity matrix used in the present invention. Here, a code length can be secured to maximum 60 bits for b=5 and check bits of 8 bits. The parity matrix shown in FIG. 1 consists of the partial matrices $A_i$ (upper five rows) and the lower three rows for odd number weighting which are used for extending the code length and for adding the SEC-DED function. If the parity matrix shown in FIG. 1 is used, the weight of the syndrome determined by the upper five rows becomes 1 or 2 for a 1-bit error but becomes 3 or more for a 3-or-more-bit error inside the 5-bit block and inside an arbitrary 4-bit burst.

For example, when 1-bit error occurs in first data bit, a syndrome is obtained as (01010) of first column and the weight of the syndrome becomes "2". When 3-bit error occurs in first, second, and fourth data bits (thus, a 3-or-more-bit error has occurred inside the 5-bit block), a syndrome is calculated as:

01010+00011+00110=01111 (modulo-2) and the weight of the syndrome becomes "4". When 3-bit error occurs in fourth, fifth, and seventh data bit (this means a 3-or-more-bit error occurred inside an arbitrary 4-bit burst), a syndrome is obtained as:

00110+10010+00011=10111 (modulo-2), and the weight of the syndrome becomes "4". The weight for the 3-or-more-bit error inside the 5-bit block and inside an arbitrary 4-bit burst is at least 3, and they can be detected without being mistaken as the 1-bit errors.

Hereinafter, it will be assumed that this embodiment deals with the case where reads and writes are made to a memory unit with 3-byte (24-bit) data and 8 check bits. The memory unit is comprised of 8 IC memories with a 4-bit structure and 6 driver/receivers of a 6-bit structure. The check bits necessary for adding the SEC-DED function to the 24-bit data may be 6 bits, but the check bits are increased to 8 bits because the 4-bit IC memory structure is used. However, the number of IC memories is not increased.

Figure 2A:
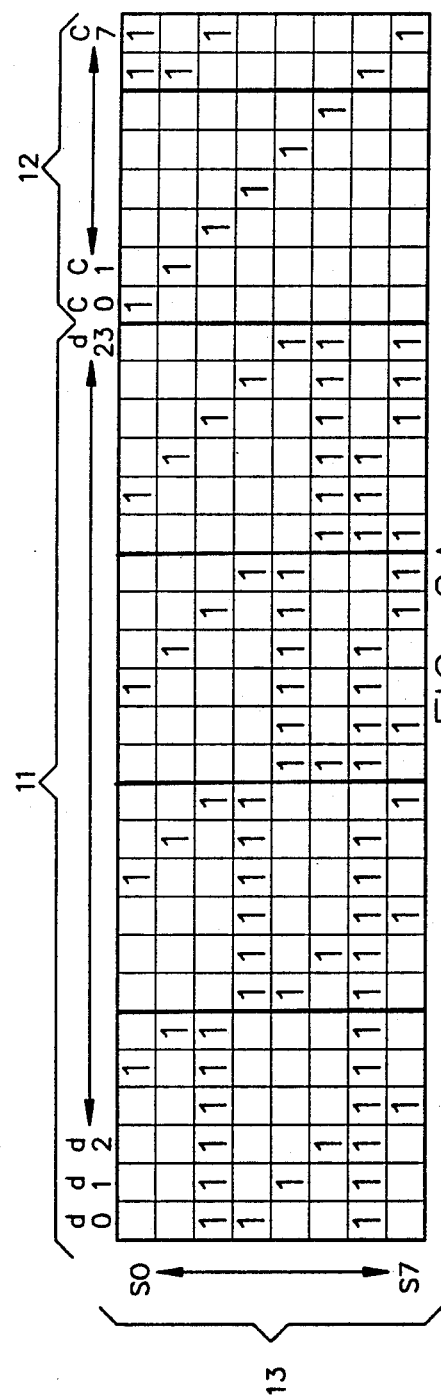
FIG. 2A is a diagram of a parity matrix used in one embodiment of the present invention.
Figure 2B:
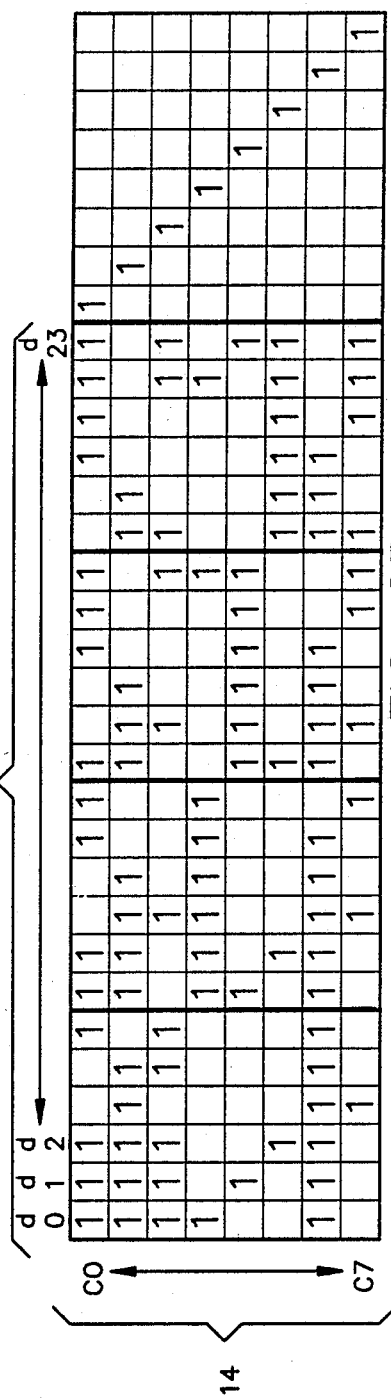
FIG. 2B is a diagram of a check bit generation matrix.

FIG. 2A shows a parity matrix applied to one embodiment of the present invention and FIG. 2B shows a check bit generation matrix.

The parity matrix shown in FIG. 2A is obtained by reducing the parity matrix for a code length of 42 bits to 32 bits for b=6 and check bits of 8 bits.

Numeral 11 denotes data bit positions, numeral 12 denotes check bit positions, numeral 13 denotes syndrome and numeral 14 denotes computed check bits. When a 1-bit error occurs in data bit position $d_0$, the syndrome ($S_0$, $S_1$, ... $S_7$) is obtained as (00110010) which is the first column of the parity matrix. When the parity matrix shown in FIG. 2A is employed, 3-or-more-bit errors in the 6-bit block and in an arbitrary 5-bit burst can be detected in addition to 1-bit error correction/2-bit error detection. Therefore, even if one IC memory (having a 4-bit structure) or one driver/receiver (having a 6-bit structure) is out of order, the trouble can be detected without error correction.

The matrix shown in FIG. 2B illustrates a check bit generation matrix. The matrix is used for obtaining the check bits (C0, C1 ... C7). For example, to obtain $C_0$, data bits corresponding to first row positions having the value "1" are selected. In this case, d0, d1, d2, d5, d6, d7, d10, d11, d12, d15, d16, d17 d20, d21, d22, and d23 are selected. The check bit C is the modulo-2 sum of these data bits.

Figure 3:
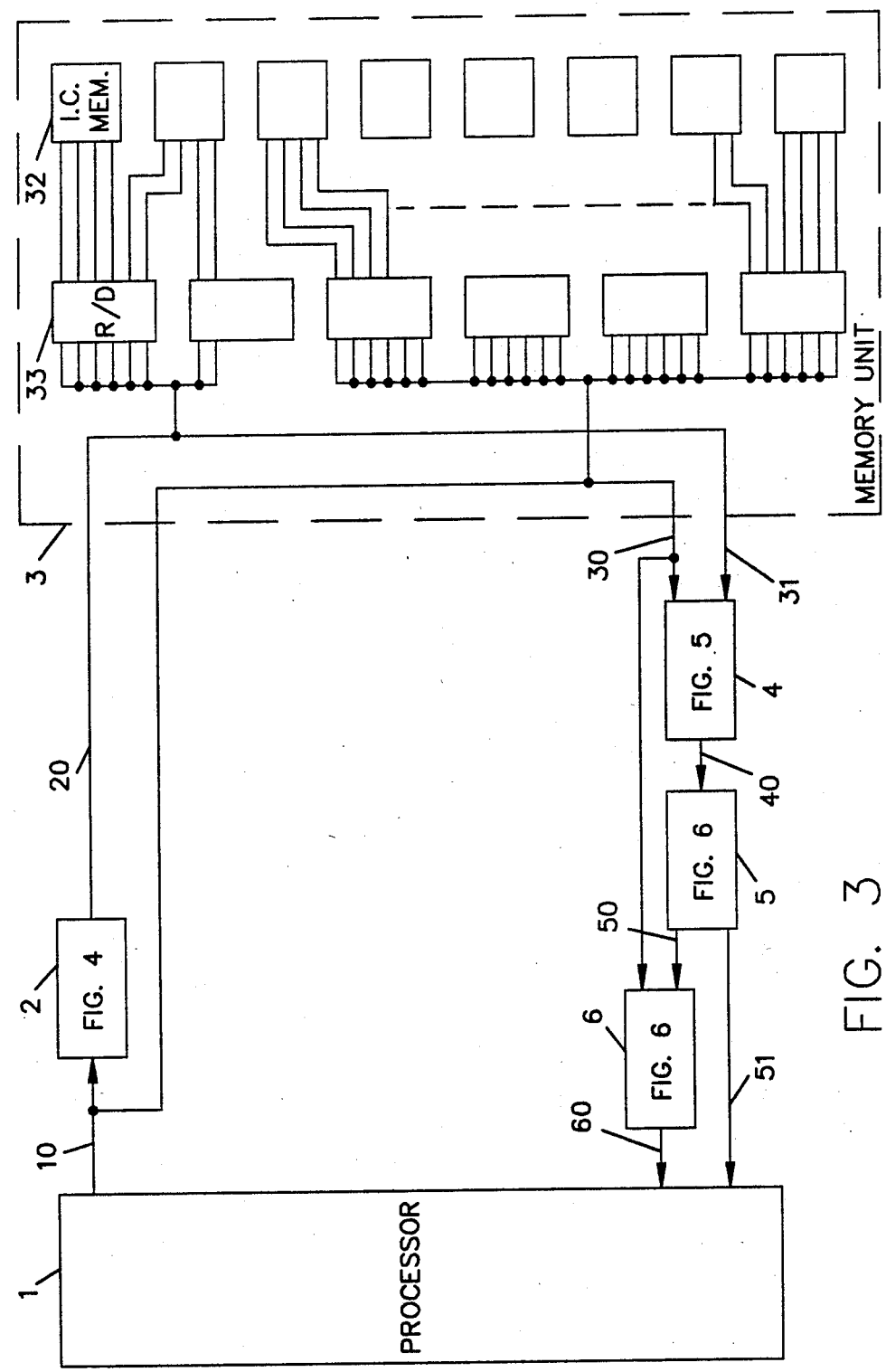
FIG. 3 is an overall configurational view of an error correction/detection apparatus in one embodiment of the present invention.

FIG. 3 is an overall configurational view of an error correction/detection system showing one embodiment of the present invention.

When data is written into a memory unit 3, the write data 10 ($SD_0\sim23$) written from the processor 1 is applied to a check bit generator 2. The check bit generator 2 generates the check bits 20 (C0~7) on the basis of the matrix shown in FIG. 2B. The detailed description of the check bit generator 2 is explained by using FIG. 4 later on. The check bits 20 thus generated are written into the memory unit 3 together with the write data 10. The memory unit 3 is comprised of 4-bit IC memories and 6 drive/receivers as described above.

When the data is read out of the memory unit 3, the read data 30 (FDO~23) and the read check bits 31 (FCO~7) are applied to a syndrome generator 4. The syndrome generator 4 generates the syndrome 40 (SO~7) on the basis of the parity matrix shown in FIG. 2A and supplies it to a syndrome decoder 5. The detail of the syndrome generator 5 is explained by using FIG. 5. The syndrome decoder 5 decodes the syndrome 40 on the basis of the parity matrix shown in FIG. 2A, generates and supplies a 1-bit error correction signal 50 to a correction circuit 6 and reports a correctable error (CE) and an uncorrectable error signal (UCE) to the processor 1 through a signal line 51. The correction circuit 6 corrects the read data 30 on the basis of the 1-bit error correction signal 50 and supplies the corrected data 60 to the processor 1.

Figure 4:
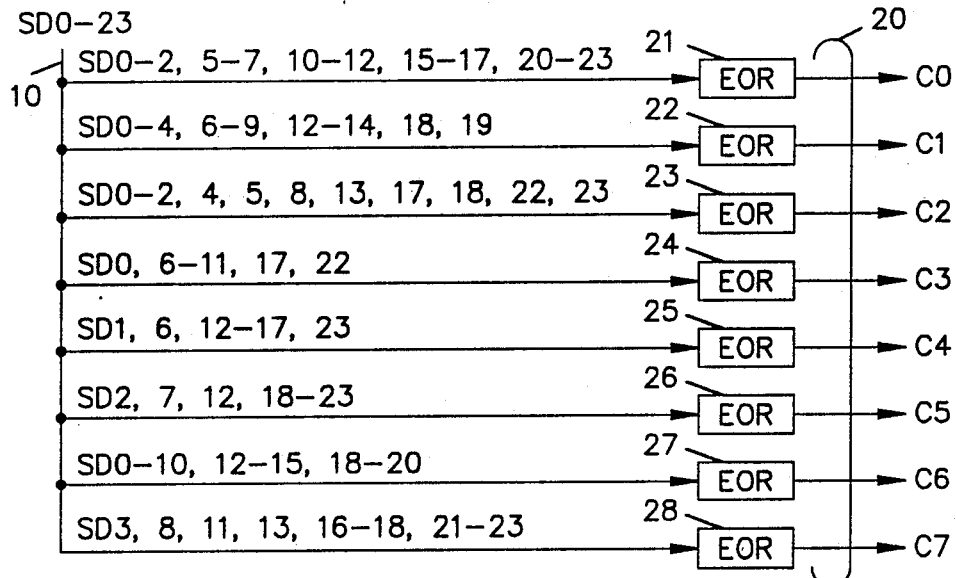
FIG. 4 is a detailed configurational view of the check bit generator shown in FIG. 3.

FIG. 4 shows one configurational example of the check bit generator 2 shown in FIG. 3.

The check bit generator 2 consists of eight 9~18-input exclusive-or gates 21~28. Each exclusive-or gate generates the 1-bit check bit on the basis of the matrix shown in FIG. 2B. The exclusive-or gate 21, for example, generates the check bit Co by computing the modulo-2 sum of the write data bits SD0~2, SD5~7, SD10~12, SD15~17, and SD20~23 on the basis of the first row of the matrix shown in FIG. 2B. If the number of write data bits whose value are "1" is an odd-number, the result of the addition is "1".

Figure 5:
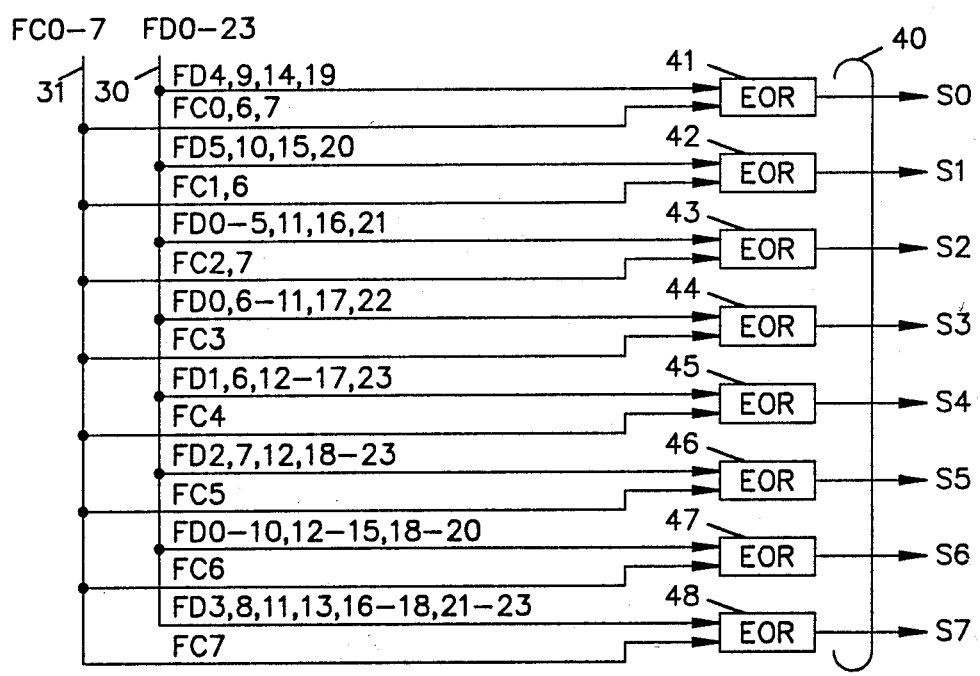
FIG. 5 is a detailed configurational view of the syndrome generator shown in FIG. 3.

FIG. 5 shows one configurational example of the syndrome generator 4 shown in FIG. 3.

The syndrome generator 4 consists of eight 6~19-input exclusive-or gate gates 41~48. Each exclusive-or gate generates the 1-bit syndrome on the basis of the parity matrix shown in FIG. 2A. The exclusive-or gate 41, for example, generates the syndrome S0 by adding the modulo-2 of the read data FD4, FD9, FD14, FD19, and the read check bits FC0, FC6, FC7 on the basis of the first row of the parity matrix shown in FIG. 2A.

Figure 6:
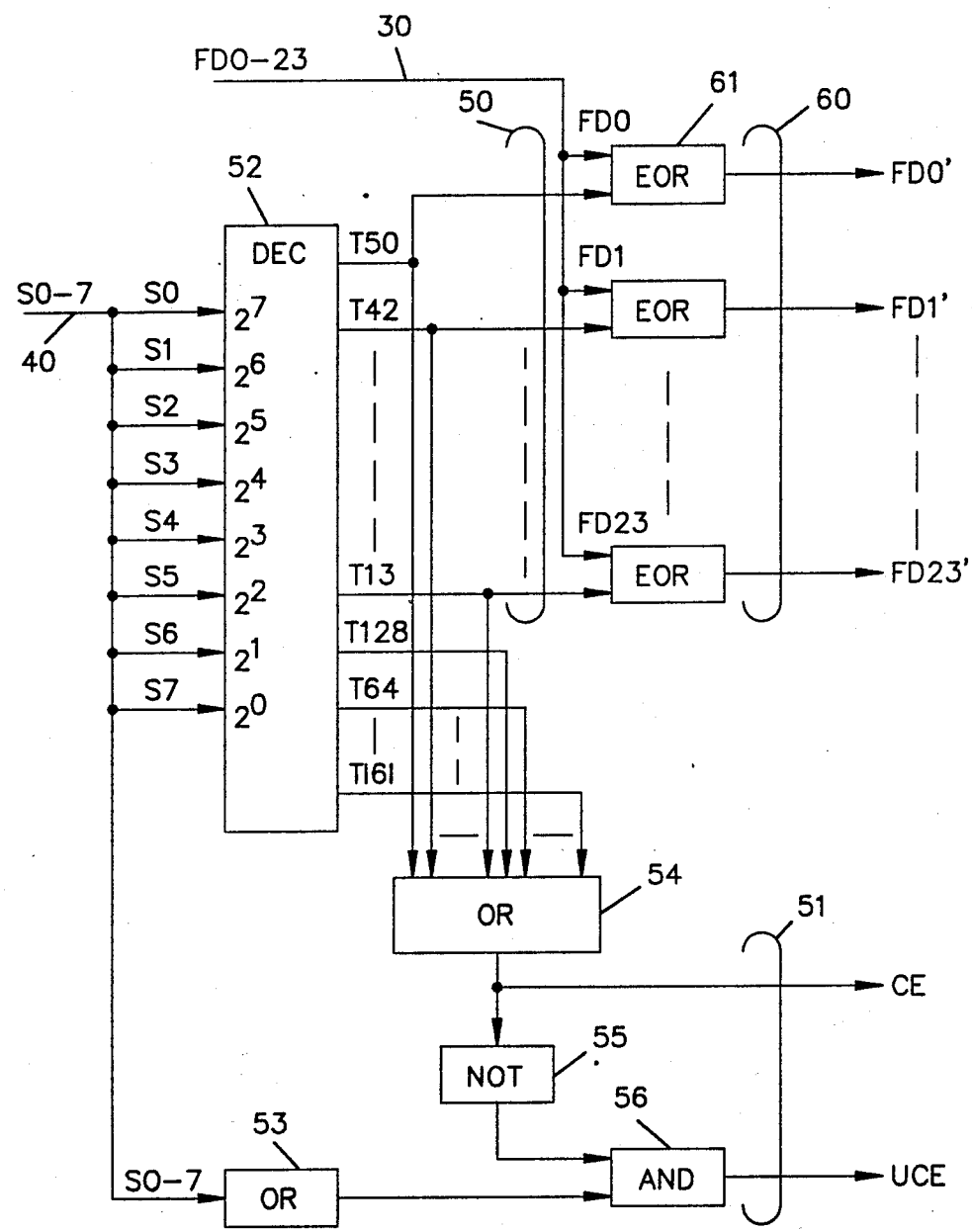
FIG. 6 is a detailed configurational view of the syndrome/correction circuit shown in FIG. 3.

FIG. 6 shows on configurational example of the syndrome decoder 5 and the correction circuit 6 shown in FIG. 3.

The syndrome decoder 5 consists of a decoder 52, or gates 53, 54, a NOT gate 55 and an AND gate 56, and the correction circuit 6 consists of twenty-four 2-input exclusive-or gates 61 corresponding to the read data FD0 to FD23. The decoder 52 detects a syndrome pattern corresponding to each column of the parity matrix shown in FIG. 2A and generates thirty-two 1-bit error correction signals. When, for example, the syndrome (So~S7) is "00110010" (50 in decimal notation) corresponding to the D0 column of the parity matrix, it excites the 1-bit error correction signal T50 of the read data FD0.

T50, T42, ... T13 corresponding to the d0, d1, d23 columns of the parity matrix are inputted to exclusive-or gates 61, which output the corrected data FD0'~FD23'. All the 1-bit error correction signals which include T128, T4, ... T161 corresponding to the C0 ... C7 columns of the parity matrix are inputted to the exclusive-or gate 54 and a correctable error report signal CE is generated. An uncorrectable error report signal UCE is excited when at least 1-bit syndrome is "1" and is not a correctable error (CE).

As described above, this embodiment can detect the 3-or-more-bit errors inside the 6-bit block and inside the 5-bit burst so that the trouble of both the IC bit having the 4-bit structure and the driver having the 6-bit structure can be detected and reliability can be improved. In addition, the embodiment described above can realize the above mentioned detection capacity without increasing the number of IC memories.

Another embodiment is described below. In this embodiment, the parity matrix P is defined as follows:

$P = [A_0 ... A_0 A_1 ... A_{b-1} ... A_{b-1} I ... I]$ where $A_i (i=1\sim b-1)$ is b×b matrix obtained by circulatingly replaced by i bits each row of $$A_0 = \begin{vmatrix} 1 & 1 & 1 & ... & 1 & & 1 \\ & 1 & & & & & \\ & & 1 & & & & \\ & & & . & & & \\ & & & & . & & \\ & & & & & 1 & \\ & & & . & & & 1 \\ 1 & 2 & 3 & ... & b-1 & b & \end{vmatrix} \begin{matrix} 1 \\ 2 \\ 3 \\ . \\ . \\ . \\ j \\ j+1 \end{matrix}$$

The principle whereby a bit block error and a (b-1)-bit burst error can be detected will be explained in detail.

In the present invention, the weight of a syndrome $S_p$ of b-bits defined by a partial matrix P is 1 or 2 for the 1-bit error. On the other hand, all the 3-or-more-bit errors inside the b-bit block and inside the (b-1)-bit burst can be detected for the following reasons:

(a) The weight of $S_p$ for the error of 3-or-more-bit inside the b-bit block is at least 3 based on the structure of Ai and I.

(b) The weight of $S_p$ for the error of 3-or-more bits but below (b-1) bits spreading over two b-bit blocks having the same partial matrix Ai or I is at least 3 according to the item (a).

(c) When its rows and columns are replaced, a bx(b-1) partial matrix A' for the (b-1)-bit burst spreading over two b-bit blocks having different partial matrices Ai and Ai+1 become:

$$A' = \begin{vmatrix} & & 1 & \ldots & 1 & & 1 \\ 1 & 1 & \ldots & 1 & & & 2 \\ & 1 & & & & & 3 \\ & & \cdot & & & & \cdot \\ & & \cdot & & & & \cdot \\ & & 1 & & & & j \\ & & & 1 & & & j+1 \\ & & & & \cdot & & \cdot \\ & & & & \cdot & & \cdot \\ & & & & & 1 & b \\ 1 & 2 & \ldots & j-1 & j & \ldots & b-1 & b \end{vmatrix}$$

The weight of $S_p$ for the 3-or-more bit error inside this burst is at least 3.

(d) When its rows and columns are replaced, the bx(b-1) partial matrix A'' for the (b-1)-bit burst spreading over two b-bit blocks having different partial matrices $A_{b-1}$ and I become:

$$A'' = \begin{vmatrix} 1 & 1 & \ldots & 1 & & & 1 \\ 1 & & & & & & 2 \\ & 1 & & & & & 3 \\ & & \cdot & & & & \cdot \\ & & \cdot & & & & \cdot \\ & & 1 & & & & j \\ & & & \cdot & & & \cdot \\ & & & \cdot & & & \cdot \\ & & & & 1 & & b \\ 1 & 2 & \ldots & j-1 & \ldots & b-1 & \end{vmatrix}$$

The weight of $S_p$ for the 3-or-more-bit error in this burst is at least 3.

From the items (a) to (d) described above, the 3-or-more-bit errors inside the b-bit block and the (b-1)-bit burst can all be detected.

Hereinafter, one embodiment of the present invention will be described in detail with reference to the drawings.

Figure 7:
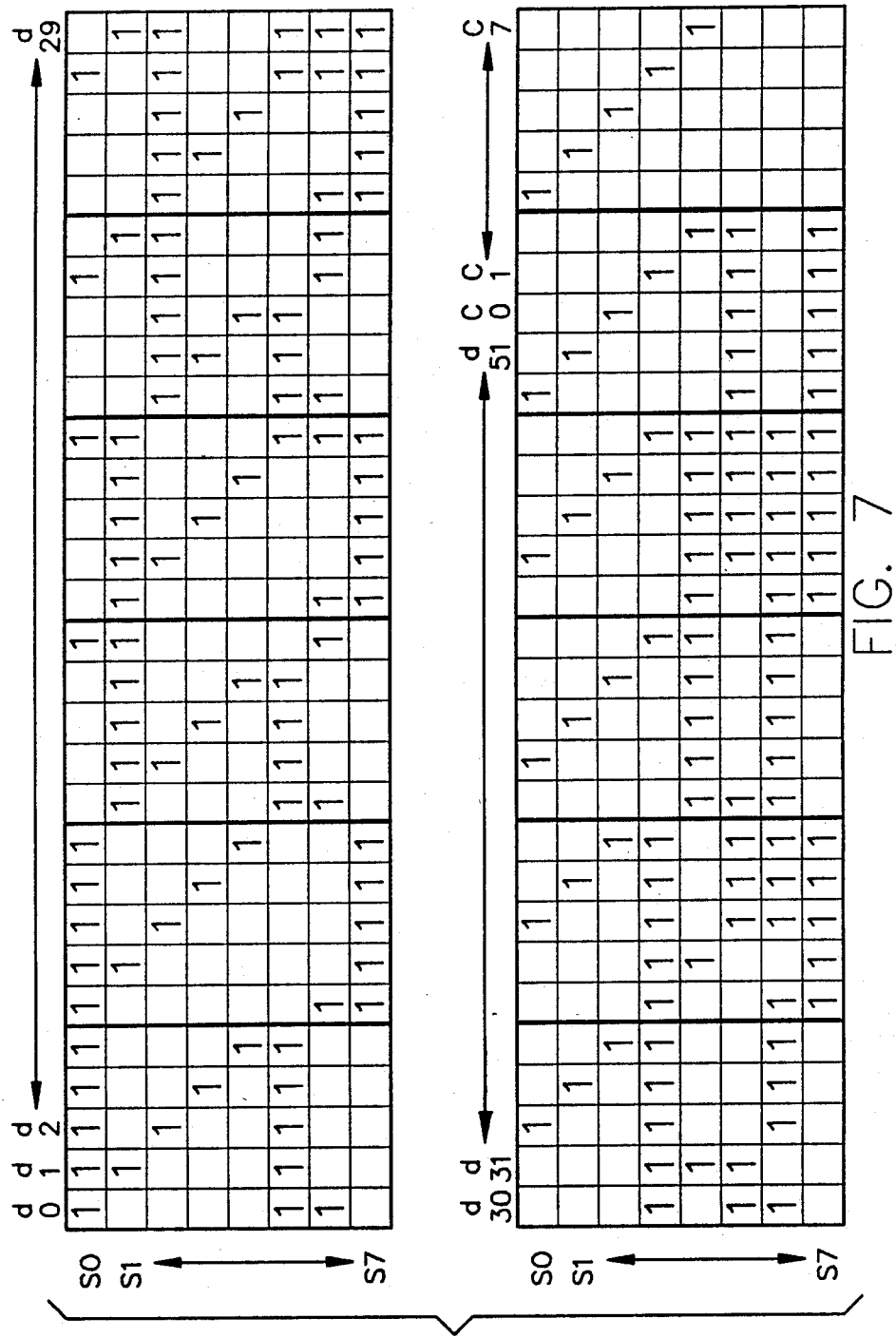
FIG. 7 is a diagram of the parity matrix used by the error correction/detection system of another embodiment.

FIG. 7 is a diagram showing one structural example of another parity matrix. Here, a code length can be secured up to maximum 60 bits for b=5 and check bits of 8 bits.

The parity matrix shown in FIG. 7 consists of partial matrix P (upper five rows) and lower three rows for odd numbered weighting that are for extending the code length and for adding SEC-DED function. In the code language shown in FIG. 7, each of the syndromes S0, Si, ... S7 is a value which is the result of calculating the exclusive-or of the corresponding row code d1 (i=0, 1, ... 51) and the corresponding check bit row Ci (i=0, ... 7). All of them become 0 when no error exists in the information code. If there is the error, on the other hand, the weight of Si of the row containing such an error becomes always 1 in the case of the 1-bit error and the weight of Si of the row containing the error becomes 0 but not 1 in the case of the 2-bit error. Therefore, 1-bit error correction/2-bit error detection is possible. In other words, if there is the 1-bit error, the bit number which becomes 1 is odd numbered among the syndromes S0~S7 and if there is the 2-bit error, the bit number which becomes 1 is even numbered among the syndromes S0~S7. In addition, if the parity matrix shown in FIG. 7 is used, the weight of the syndrome determined by the upper five rows is 1 or 2 for the 1-bit error but is at least 3 for the 3-or-more-bit error inside the 5-bit block and inside an arbitrary 4-bit burst in this embodiment. Thus, this embodiment can detect such errors.

Figure 8A:
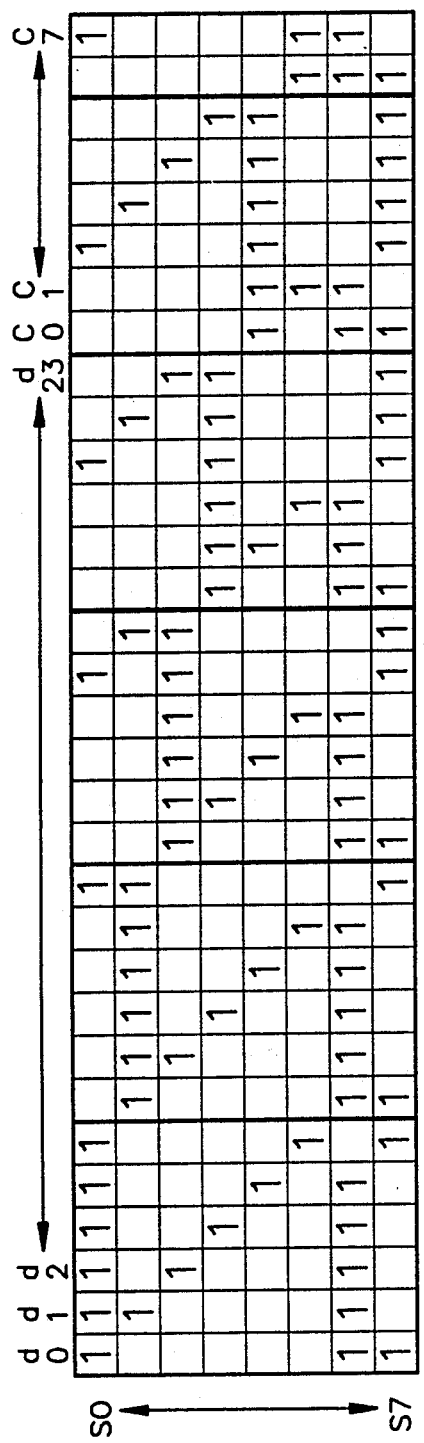
FIG. 8A is a diagram of a parity matrix used in the other embodiment.
Figure 8B:
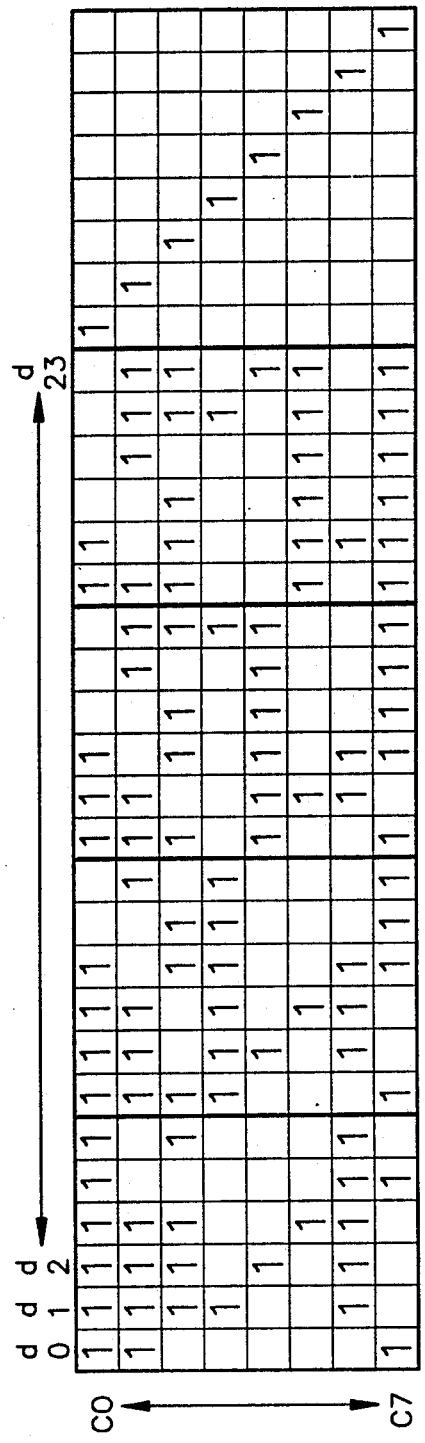
FIG. 8B is a diagram of a check bit generation matrix of the other embodiment.

FIG. 8A shows a parity matrix applied to another embodiment of the present invention and FIG. 8B shows a check bit generation matrix.

In the embodiment, it will be assumed that read and write is made to the same memory unit as the embodiment of FIG. 3. The check bit necessary for adding the SEC-DED function to the 24-bit data may be 6 bits, but the check bit is increased to 8 bits because the IC memory structure is of 4-bits used. However, the number of IC memories is not increased.

The parity matrix shown in FIG. 8A is obtained by reducing the parity matrix for a code length of 42 bits to 32 bits. When the parity matrix shown in FIG. 8A is employed, 3-or-more-bit errors in the 6-bit block and in an arbitrary 5-bit burst can be detected in addition to 1-bit error correction/2-bit error detection. Therefore, even if one IC memory (having a 4-bit structure) or one driver/receiver (having a 6-bit structure) is out of order, the trouble can be detected without error correction.

The matrix shown in FIG. 8B illustrates a check bit generation matrix which is obtained by applying a known equivalent row operation to the parity matrix shown in FIG. 8A so that the check bit portion (C0 to C7) becomes a unit matrix.

The matrix shown in FIG. 8B is used for obtaining the check bit portion (Co to C7) in the check bit generator of FIG. 3, and the matrix shown in FIG. 8A used for the syndrome (S0 to S7) in the syndrome decoder of FIG. 3.

Figure 9:
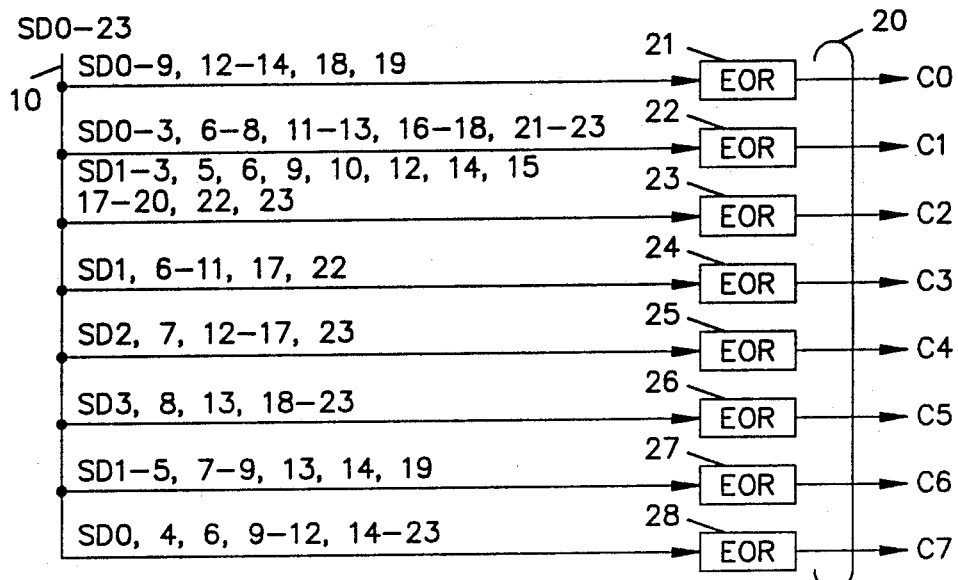
FIG. 9 is a detailed configurational view of the check bit generator shown in FIG. 3 embodying FIGURE 8($b$); and, FIG. 10 is a detailed configurational view of the syndrome generator shown in FIG. 3 embodying FIG. 8(A).

FIG. 9 shows one configurational example of the check bit generator of the embodiment. The check bit generator consists of eight 9~17-input exclusive-or gates 21~28. Each exclusive-or gate generates the 1-bit check bit on the basis of the matrix shown in FIG. 8B. The exclusive-or gate 21, for example, generates the check bit C0 by adding modulo-2 of the write data SD0~SD9, SD12~SD14, SD18 and SD19 on the basis of the first row of the matrix shown in FIG. 8B.

Figure 10:
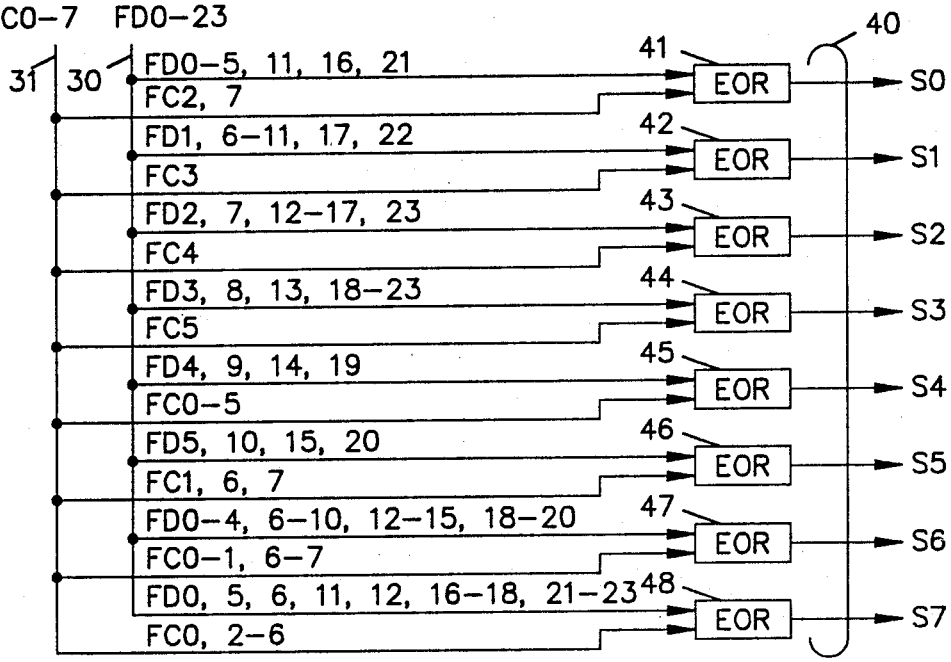

FIG. 10 shows one structural example of the syndrome generator of the embodiment.

The syndrome generator consists of eight 7~21-input exclusive-or gates 41~48. Each exclusive-or gate generates the 1-bit syndrome on the basis of the parity matrix shown in FIG. 8A. The exclusive-or gate 41, for example, generates the syndrome by adding the modulo-2 of the read data FD0~FD5, FD11, FD16, FD21, and the read check bits FC2, FC7 on the basis of the first row of the parity matrix shown in FIG. 2A.

The syndrome decoder and the correction circuit has the same construction as the embodiments in FIG. 6.

As described above, the present invention can detect the (b-1)-bit burst error in addition to 1-bit error correction/2-bit error detection/b-bit block error detection. Therefore, the present invention can accomplish error correction and detection with a high degree of differentiation in the types of errors detected.

The invention has been described with reference to the preferred embodiments. Obviously, modifications and alterations will occur to others upon reading and understanding the preceding specification. It is intended that the invention be construed as including all such alterations and modifications insofar as they come within the scope of the appended claims or the equivalents thereof.

Having thus described the preferred embodiment, the invention is now claimed to be:

1. An error detection apparatus comprising:
   means for generating information which has a plurality of bits;
   means for obtaining a syndrome from the information bits by using a parity matrix containing at least one of the following $b \times b$ partial parity matrices Ao to Ab where b is the number of bits in a block of the information bits; and
   where Ai (i=0~b) is a $b \times b$ matrix with Ai=B·Ci and Ci(i=0~b) is a $b \times b$ martix obtained by multiplying a $b \times b$ matrix i times by C, that is:

$$C = \begin{vmatrix} 1 & 1 & 1 & \ldots & 1 & 1 \\ 1 & & & & & \\ & 1 & & & & \\ & & 1 & & & \\ & & & \ddots & & \\ & & & & 1 & \\ & & & & & 1 \\ 1 & 2 & 3 & \ldots & b-1 & b \end{vmatrix} \begin{vmatrix} 1 \\ 2 \\ 3 \\ 4 \\ \vdots \\ b-1 \\ b \end{vmatrix}$$

B is a $b \times b$ matrix obtained by arbitrarily replacing the rows and columns of Ci.

2. The error detection apparatus of claim 1 wherein the generating means comprises a plurality of memories each of which outputs b bits of information in parallel.

3. The error detection apparatus of claim 2 wherein the apparatus further comprises an encoder for generating check bits from original data and a matrix representative of the parity matrix, means for storing the check bits in the memory as a part of the information, and means for storing the original data in the memories as another part of the information.

4. The error detection apparatus of claim 3 wherein the encoder includes a plurality of means for producing a 1 bit check code on the basis of the original data and one of the rows of the matrix representative of the parity matrix.

5. The error detection apparatus of claim 4 wherein the plurality of producing means includes means for selecting bits of the original data from the corresponding row, and means for detecting whether the sum of the data on the selected bits is an odd number.

6. The error detection apparatus of claim 1 wherein the obtaining means comprises a plurality of means each for producing a syndrome for each bit from the information and one of the rows of the parity matrix.

7. The error detection apparatus of claim 6 wherein the detecting means comprises means responsive to the syndrome for generating an uncorrectable error signal.

8. The error detection apparatus of claim 7 wherein the plurality of producing means including means of selecting bits of the information from the corresponding row and means for detecting whether a sum of data on the selected bits is an odd number.

9. The error detection apparatus of claim 1 wherein a (b=1) set of row vectors is comprised of $D_0=1 \ldots 1$, $D_1=1\,0 \ldots 0$, $D_2=010 \ldots 0$ to $D_b=0 \ldots 01$.

10. The error detection apparatus of claim 9 wherein the $b \times b$ matrix B is comprised of a subset of b row vectors from the (b+1) set of row vectors $D_0$ to $D_b$.

11. An error detection apparatus according to claim 1 wherein one of $b \times b$ matrices Ao to Ab having subscript (i) and another $b \times b$ matrix having a subscript (i+1) are put side by side.

12. An error detection apparatus according to claim 11 wherein a plurality of $b \times b$ matrices having the same subscript are juxtaposed.

13. An error detection method comprising the steps of generating information which has a plurality of bits;
   obtaining a syndrome from the information and a parity matrix containing at least one of the following $b \times b$ partial parity matrices Ao to Ab; and,
   where Ai (i=0−b) is a $b \times b$ matrix with Ai=B·Ci, and Ci(i=0−b) is a $b \times b$ obtained by multiplying a $b \times b$ matrix i times by C, that is:

$$C = \begin{vmatrix} 1 & 1 & 1 & \ldots & 1 & 1 \\ 1 & & & & & \\ & 1 & & & & \\ & & 1 & & & \\ & & & \ddots & & \\ & & & & 1 & \\ & & & & & 1 \\ 1 & 2 & 3 & \ldots & b-1 & b \end{vmatrix} \begin{vmatrix} 1 \\ 2 \\ 3 \\ 4 \\ \vdots \\ b-1 \\ b \end{vmatrix}$$

B is a $b \times b$ matrix obtained by arbitrarily replacing the rows and columns of Ci.

14. The error detection method of claim 13 wherein the obtaining step includes the steps of selecting bits of the information from each row of the parity matrix, and detecting whether each sum of data on the selected bits by one row is an odd number.

15. The error detection method of claim 13 wherein the generating step further comprises the step of producing check bits from original data and a matrix representative of the parity matrix wherein the check bits and the original data represent the information.

16. The error detection method of claim 15 wherein the producing step comprises the steps of selecting bits of the original data from each row of the matrix representative of the parity matrix and detecting whether each sum of data on the selected bits by one row is an odd number.

17. An error detection apparatus comprising:
   means for generating information which has a plurality of bits;
   means for obtaining syndrome from the information and a parity matrix containing at least one of the following b×b partial parity matrices Ao to Ab where b is the number of bits in a block of the information bits; and, means responsive to the the syndrome for detecting error of the information:

where Ai (i=1~b−1) is a b×b matrix obtained by circulatingly replacing by i bits each $$Ao = \begin{bmatrix} 1 & 1 & 1 & \ldots & 1 & 1 \\ & 1 & & & & \\ & & 1 & & & \\ & & & \cdot & & \\ & & & & \cdot & \\ & & & & & 1 \\ 1 & 2 & 3 & \ldots & b-1 & b \end{bmatrix} \begin{bmatrix} 1 \\ 2 \\ 3 \\ \cdot \\ \cdot \\ b-1 \\ b \end{bmatrix}$$

18. The error detection apparatus of claim 17 wherein the generating means comprises a plurality of memories each of which outputs b bits of information in parallel.

19. The error detection apparatus of claim 17 wherein the obtaining means comprises a plurality of means each producing a 1 bit syndrome on the basis of the information and one row of the parity matrix.

20. The error detection apparatus of claim 19 wherein the plurality of producing means including means of selecting bits of information from the corresponding row, and means for detecting whether the sum of data on the selected bits is an odd number.

21. The error detection apparatus of claim 20 wherein the apparatus further comprises an encoder for generating check bits from original data and a matrix representative of the parity matrix, means for storing the check bits in the memory as a part of the information, and means for storing the original data in the memories as the other part of the information.

22. The error detection apparatus of claim 21 wherein the encoder includes a plurality of the means for producing a 1 bit check code from the original data and one of the matrix representative of the parity matrix.

23. The error detection apparatus of claim 20 wherein the plurality of producing means includes means of selecting bits of the original data from the corresponding row, and means for detecting whether the sum of data on the selected bits is an odd number.

24. An error detection apparatus according to claim 17 wherein one of b×b matrices Ao to Ab having a subscript (i) and another b×b matrix having a subscript (i+1) are put side by side.

25. An error detection apparatus according to claim 24 wherein a plurality of b×b matrices having the same subscript are juxtaposed.

26. An error detection apparatus comprising:
means for generating information which has a plurality of bits;
means for obtaining a syndrome from the information and a parity matrix A;
means responsive to the syndrome for detecting an error in the information;
wherein the parity matrix A is a b×b matrix having a row vector Do and b-1 different row vectors selected from b row vectors D1 to Db;
wherein the row vectors Do to Db are defined as follows:

$$D0 = 1\ 1\ 1\ \ldots\ 1\ 1$$
$$D1 = 1\ 0\ 0\ \ldots\ 0\ 0$$
$$D2 = 0\ 1\ 0\ \ldots\ 0\ 0$$
$$\int$$
$$Db = 0\ 0\ 0\ \ldots\ 0\ 1$$

* * * * *